(12) United States Patent
Liu et al.

(10) Patent No.: US 11,239,077 B2
(45) Date of Patent: Feb. 1, 2022

(54) LITHO-ETCH-LITHO-ETCH WITH SELF-ALIGNED BLOCKS

(71) Applicant: INTERNATIONAL BUSINESS MACHINES CORPORATION, Armonk, NY (US)

(72) Inventors: Chi-Chun Liu, Altamont, NY (US); Nelson Felix, Slingerlands, NY (US); Yann Mignot, Slingerlands, NY (US); Ekmini Anuja De Silva, Slingerlands, NY (US); John Arnold, North Chatham, NY (US); Allen Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 16/682,494

(22) Filed: Nov. 13, 2019

(65) Prior Publication Data
US 2021/0143013 A1    May 13, 2021

(51) Int. Cl.
*H01L 21/4763* (2006.01)
*H01L 21/033* (2006.01)
(Continued)

(52) U.S. Cl.
CPC ...... *H01L 21/0338* (2013.01); *H01L 21/0335* (2013.01); *H01L 21/0337* (2013.01);
(Continued)

(58) Field of Classification Search
CPC ............. H01L 21/0338; H01L 21/0335; H01L 21/0337; H01L 21/3212; H01L 21/76816; H01L 21/7684; H01L 21/76877; H01L 21/76897; H01L 21/027–0338; H01L 21/314–3185; H01L 21/308–3088; H01L 21/31144; H01L 21/32139; H01L 21/467; H01L 21/475; H01L 21/469–47576;
(Continued)

(56) References Cited

U.S. PATENT DOCUMENTS 8,871,651 B1 * 10/2014 Choi ................. H01L 29/66795
                                                            438/717
8,987,142 B2    3/2015 Lee et al.
(Continued)

OTHER PUBLICATIONS

Briggs, "N5 Technology Node Dual-Damascene Interconnects Enabled Using Multi Patterning", IEEE International Interconnect Technology Conference, May 2017, 3 pages.
(Continued)

*Primary Examiner* — Calvin Y Choi
(74) *Attorney, Agent, or Firm* — Tutunjian & Bitetto, P.C.; Abdy Raissinia (57) ABSTRACT

A method for fabricating a semiconductor device includes forming a plurality of mandrel cuts from a first set of mandrels of a base structure using lithography, surrounding the first set of mandrels and a second set of mandrels of the base structure with spacer material to form mandrel-spacer structures, forming a flowable material layer on exposed surfaces of the mandrel-spacer structures, and performing additional processing, including forming a plurality of dielectric trenches within the base structure based on patterns formed in the flowable material layer.

20 Claims, 6 Drawing Sheets

(51) Int. Cl.
*H01L 21/321* (2006.01)
*H01L 21/768* (2006.01)

(52) U.S. Cl.
CPC ...... *H01L 21/3212* (2013.01); *H01L 21/7684* (2013.01); *H01L 21/76816* (2013.01); *H01L 21/76877* (2013.01); *H01L 21/76897* (2013.01)

(58) Field of Classification Search
CPC ... H01L 51/0018; H01L 21/0273–0279; H01L 21/312–3128; H01L 21/30625; H01L 21/31051; H01L 21/4896; H01L 21/4878; H01L 21/4842; H01L 21/463; H01L 21/32131–32132; H01L 21/304–3046; H01L 21/2633; H01L 21/02024; H01L 21/02013
USPC .......................................................... 438/633
See application file for complete search history.

(56) References Cited

U.S. PATENT DOCUMENTS

| | | |
|---|---|---|
| 8,992,792 B2 | 3/2015 | Chang et al. |
| 9,245,763 B2 | 1/2016 | Chang et al. |
| 9,478,462 B1 | 10/2016 | Wang et al. |
| 9,773,676 B2 | 9/2017 | Chang et al. |
| 9,991,156 B2 | 6/2018 | Burns et al. |
| 10,157,789 B2 | 12/2018 | Chen et al. |
| 2014/0193974 A1 | 7/2014 | Lee et al. |
| 2017/0025540 A1* | 1/2017 | Liou ................ H01L 29/66545 |

OTHER PUBLICATIONS

Raley, "Self-Aligned Blocking Intergration Demonstration for Critical sub 40nm pitch Mx Level Patterning", Advanced Etch Technology for Nanopatterning, Apr. 2018, 11 pages.

* cited by examiner

LITHO-ETCH-LITHO-ETCH WITH SELF-ALIGNED BLOCKS

BACKGROUND

The present invention generally relates to semiconductor devices, and more particularly to semiconductor devices including self-aligned vias and blocks and methods of forming the same.

For back-end-of-line (BEOL) patterning targeting a sub-30 nm pitch, self-aligned double patterning (SADP) can be employed as an option. Although SADP can result in uniform line arrays, in order to satisfy design flexibility and circuit performance needs, additional masks can be needed to remove unwanted line segments from the arrays. Therefore, SADP can increase process complexity and cost.

SUMMARY

In accordance with an embodiment, a method for fabricating a semiconductor device including self-aligned vias and self-aligned blocks is provided. The method includes forming a plurality of mandrel cuts from a first set of mandrels of a base structure using lithography, surrounding the first set of mandrels and a second set of mandrels of the base structure with spacer material to form mandrel-spacer structures, forming a flowable material layer on exposed surfaces of the mandrel-spacer structures, and performing additional processing, including forming a plurality of dielectric trenches within the base structure based on patterns formed in the flowable material layer.

In accordance with another embodiment, a method for fabricating a semiconductor device including self-aligned vias and self-aligned blocks is provided. The method includes forming a plurality of mandrels including a first set of mandrels and a second set of mandrels from mandrel material of a base structure, forming a plurality of mandrel cuts from the first set of mandrels using lithography, including performing a partial organic planarization layer (OPL) etch, surrounding the first set of mandrels and a second set of mandrels of the base structure with spacer material to form mandrel-spacer structures, forming a flowable material layer on exposed surfaces of the mandrel-spacer structures, and performing additional processing, including forming a plurality of dielectric trenches within the base structure based on patterns formed in the flowable material layer.

In accordance with yet another embodiment, a method for fabricating a semiconductor device including self-aligned vias and self-aligned blocks is provided. The method includes forming, on a hardmask layer of a base structure, a plurality of mandrels including a first set of mandrels and a second set of mandrels from mandrel material of a base structure. The base structure further includes a substrate and at least one dielectric sublayer formed on the substrate. The method further includes forming a plurality of mandrel cuts from the first set of mandrels using lithography, including performing a partial organic planarization layer (OPL) etch, surrounding the first set of mandrels and a second set of mandrels of the base structure with spacer material to form mandrel-spacer structures, including depositing the spacer material around the plurality of mandrels and on the hardmask layer, forming a flowable material layer on exposed surfaces of the mandrel-spacer structures, and performing additional processing. Performing the additional processing includes transferring non-mandrel shape patterns into the flowable material layer, forming non-mandrel cut patterns in the flowable material layer, etching back the spacer material to expose surfaces of the plurality of mandrels, selectively removing mandrel and non-mandrel materials including the plurality of mandrels and the flowable material layer to form a final pattern including remaining portions of the spacer material, etching the hardmask layer using the final pattern, removing the remaining portions of the spacer material, and forming a plurality of dielectric trenches within the base structure based on the patterns. The method further includes performing a metallization process, including removing the hardmask layer, forming conductive material and planarizing the conductive material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for a litho-etch-litho-etch (LELE) patterning process (e.g., LELE double patterning process) where the second litho-etch process can self-align to the first litho-etch process and maintain constant spacing between the lines defined by the LELE process. At the same time, self-aligned blocks and self-aligned vias can be enabled. For example, the LELE process in accordance with the embodiments described herein can incorporate self-aligned blocks and self-aligned vias simultaneously for sub-30 nm pitch back-end-of-line (BEOL) patterning, and can be used to form trenches, and an optional via double patterning process can be implemented to form vias.

More specifically, the LELE patterning process can include a spacer-assisted LELE (SALELE) patterning process. In the SALELE process described herein, a spacer can be used as an etch protection layer to maintain the distance between conductive lines while allowing greater design flexibility as compared to uniform arrays derived from other processes such as, e.g., SADP. The SALELE process described herein illustrates SADP-like behavior at the dense region, and spacing between metals is not determined by lithography critical dimension (CD) or overlay but by the spacer, thereby resulting in improved time-dependent dielectric breakdown (TDDB), overlay tolerance and CD control. Additionally, mask count reduction can be achieved, such that no additional "dummy segment removal" or line-end loop clean-up is needed. The embodiments described herein further provide design flexibility in terms of CD and pitch (e.g., power rail). The embodiments described herein can improve CD uniformity (CDU) and/or line edge roughness (LER), which are parameters associated with trench pattern formation, by using "line mandrel plus trim" instead of "trench mandrel." An "organic planarization layer (OPL) partial etchback" technique can be used to reduce or eliminate dielectric material damage prior to performing a selective mandrel pull.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
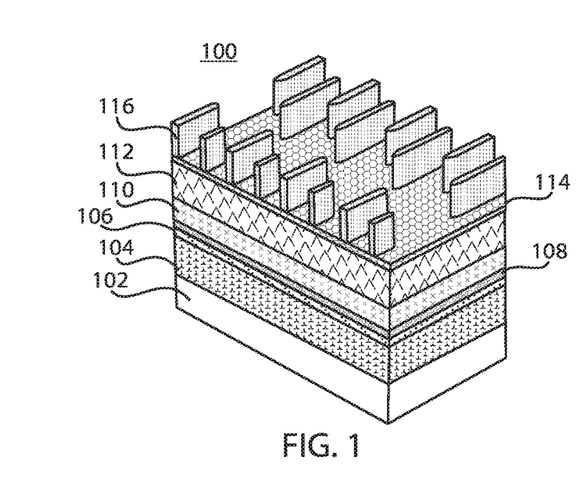
FIG. 1 is a perspective view of the definition of mandrel patterns in a photoresist during the fabrication of a semiconductor device, in accordance with an embodiment of the present invention.

Referring now to the drawings in which like numerals represent the same or similar elements and initially to FIG. 1, a perspective view of semiconductor device 100 is provided. The device 100 can include a substrate 102.

The device 100 can further include a dielectric layer including one or more sublayers disposed on the substrate 102. For example, as shown in FIG. 1, the one or more sublayers can include a first dielectric sublayer 104 and a second dielectric sublayer 106. The first dielectric sublayer 104 can include any suitable dielectric material in accordance with the embodiments described herein. In one embodiment, the first dielectric sublayer 104 can include an ultra-low-k (ULK) film. For example, the first dielectric sublayer 104 can include a dielectric material having a dielectric constant, k, ranging from between, e.g., about 2.0 to about 4.0. Additionally, the first dielectric sublayer 104 can have a thickness ranging from between, e.g., about 40 nanometers (nm) to about 150 nm. The second dielectric sublayer 106 can include any suitable material in accordance with the embodiments described herein. For example, the second dielectric sublayer 106 can include a silicon carbide material. In one embodiment, the second dielectric sublayer 106 can include a nitrogen-doped silicon carbide.

The device 100 can further include a hardmask layer 108 formed on the second dielectric sublayer 106. The hardmask layer 108 can include any suitable material in accordance with the embodiments described herein, including but not limited to amorphous silicon (aSi), titanium nitride (TiN), etc.

The device 100 can further include a mandrel material layer 110 formed on the hardmask layer 108. As will be described in further detail below with reference to FIG. 2, a plurality of mandrels will be formed from the mandrel material layer 110. The mandrel material layer 110 can include any suitable material in accordance with the embodiments described herein. For example, the mandrel material layer 110 can include, e.g., a silicon nitride material (e.g. SiN).

The device 100 can further include a plurality of lithography layers used for patterning the mandrel material layer 110 into a plurality of mandrels, as will be described in further detail below with reference to FIG. 2. More specifically, the device 100 can include an organic planarization layer (OPL) 112, an anti-reflective coating (ARC) layer 114, and a photoresist (PR) layer 116 formed on the mandrel material 110. The OPL 112, the ARC layer 114 and the PR layer 116 can include any suitable materials in accordance with the embodiments described herein.

Figure 2:
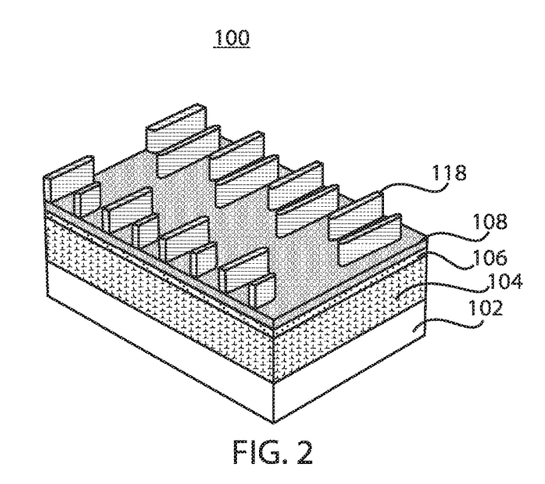
FIG. 2 is a perspective view of pattern transfer from the photoresist to a target material during the fabrication of the semiconductor device, in accordance with an embodiment of the present invention.

With reference to FIG. 2, a plurality of mandrels 118 are formed from the mandrel material layer 110 using the OPL 112, the ARC layer 114 and the PR layer 116 (shown in FIG. 1), and the OPL 112, the ARC layer 114 and the PR layer 116 are removed. The substrate 102, the dielectric sublayers 104 and 106, the hardmask layer 108 and the mandrels 118 collectively form what is referred to herein as a base structure. Any suitable lithography/patterning process can be used to form the plurality of mandrels 118 and remove the OPL 112, the ARC layer 114 and the PR layer 116 in accordance with the embodiments described herein.

Figure 3:
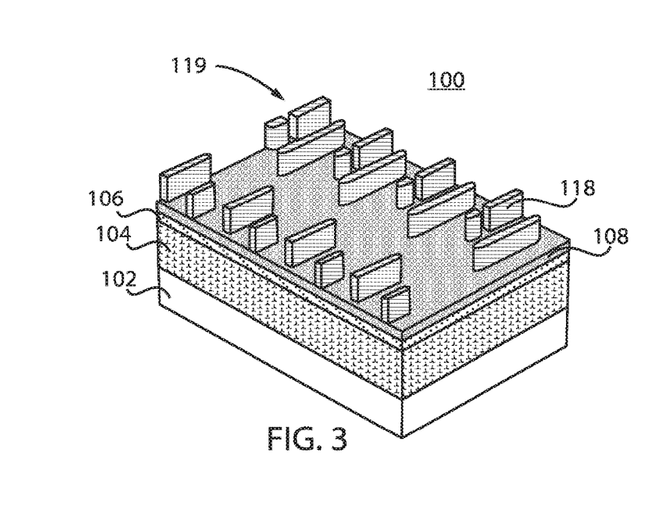
FIG. 3 is a perspective view of the definition of mandrel cut shapes and transfer of the mandrel cut shapes to mandrel material during the fabrication of the semiconductor device, in accordance with an embodiment of the present invention.

With reference to FIG. 3, a first cut is performed to cut a portion of the plurality of mandrels 118, thereby forming cuts 119. After the first cut is performed, an OPL ash can be used to remove the second OPL layer.

In one embodiment, a partial OPL etch technique can be used to perform the first cut. More specifically, one or more lithography layers including a second OPL layer can be formed, and mandrel reveal is performed by employing the partial OPL etch technique. The partial OPL etch technique can be used to avoid damage to the hardmask layer 108 near the cut, and thus avoid unintended defects and dielectric material (e.g., ULK) damage during mandrel pull. The partial OPL etch can be needed for spin-on tone-inversion.

In another embodiment, first cut can be achieved in a later stage (e.g., after spacer deposition and etchback). The same partial OPL etch can be used to reveal the top of the mandrel, followed by a mandrel etch (e.g., reactive-ion etch (RIE)) selective to spacer, and then a backfill of the cut in mandrel with a spin-on glass material while OPL is still in place. Etch back and OPL ashing can leave a plug in the plurality of mandrels 118 which can be used as a cut later on.

Figure 4:
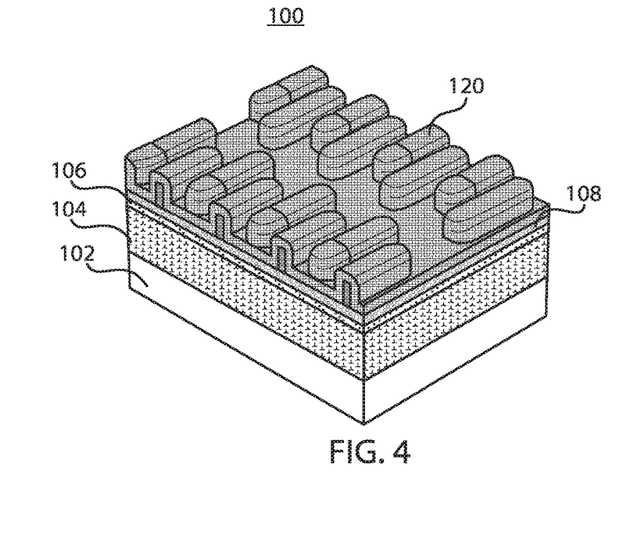
FIG. 4 is a perspective view of conformal spacer deposition around the mandrel with etch back to form a mandrel/spacer structure during the fabrication of the semiconductor device, in accordance with an embodiment of the present invention.

With reference to FIG. 4, spacer material 120 can be conformally deposited around the mandrels 118 and on the hardmask layer 108. The cuts 119 shown in FIG. 3 are pinched off by the spacer material 120. Such a process can be simpler as compared to spin-on tone-inversion. The spacer material 120 can include any suitable material in accordance with the embodiments described herein, including but not limited to titanium nitride (TiN), tantalum nitride (TaN), a titanium oxide material (TiO$_x$), aluminum oxide (Al$_2$O$_3$), etc.

Figure 5:
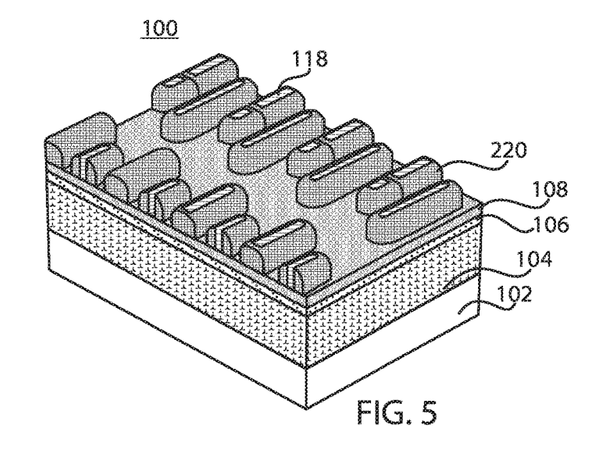
FIG. 5 is a perspective view of an alternative conformal spacer deposition without etch back to form a mandrel/spacer structure during the fabrication of the semiconductor device, in accordance with another embodiment of the present invention.

With reference to FIG. 5, in an alternative embodiment, a semiconductor device 200 is shown including layers 102 through 118 described above with reference to FIGS. 1-3. However, instead of the spacer material 120, a plurality of spacers 220 can be formed about the plurality of mandrels 118. The plurality of spacers 220 can be formed by depositing spacer material over the mandrels 118, the cuts 119 and the hardmask layer 108, and etching back the spacer material.

Compared to the plug approach described above in FIG. 3 that can be used to form the first cut, relying on spacer-pinch off to form the cut, such as that shown in FIG. 3 and the spacer formation shown in either FIG. 4 or FIG. 5, can simplify device processing.

Figure 6:
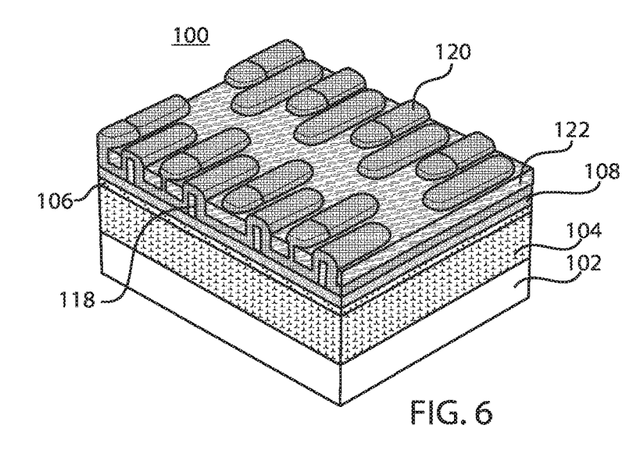
FIG. 6 is a perspective view of the formation of a flowable material layer during the fabrication of the semiconductor device, in accordance with an embodiment of the present invention.

With reference to FIG. 6, a flowable material layer 122 is formed between the spacing between the structures defined by the mandrels 118 and the spacer material 120. Any suitable process can be used to form the flowable material layer 122 in accordance with the embodiments described herein. The flowable material layer 122 can be formed by backfilling the spacing with a flowable material, and then polishing the flowable material to reveal the top of the mandrel/spacer structures. The flowable material layer 122 can include any suitable material in accordance with the embodiments described herein. For example, the flowable material layer 122 can include, e.g., a spin-on-glass (SOG) material and/or other chemical vapor deposition (CVD)-based flowable materials.

Figure 7:
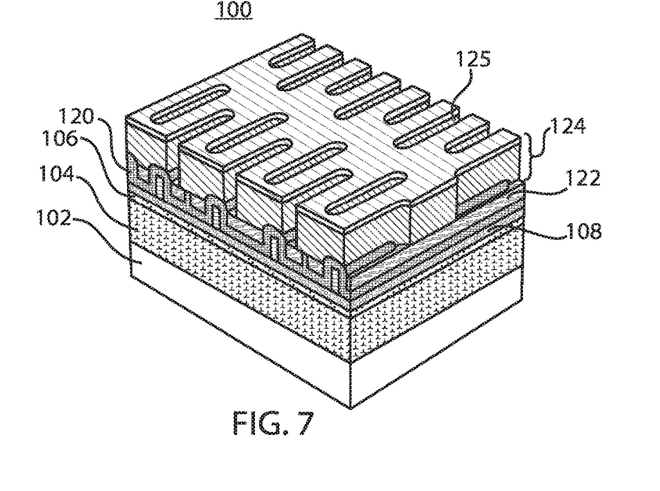
FIG. 7 is a perspective view of the definition of non-mandrel shapes and transfer of the non-mandrel shapes onto patterning material during the fabrication of the semiconductor device, in accordance with an embodiment of the present invention.

With reference to FIG. 7, lithography is used to define non-mandrel shape patterns 125 transferred onto patterning material 124. The patterning material 124 can include any suitable patterning material(s) in accordance with the embodiments described herein. For example, the patterning material 124 can include an OPL layer and an ARC (e.g., SiARC) layer. Accordingly, the flowable material layer 122 can memorize the non-mandrel pattern after the etch process.

Figure 8:
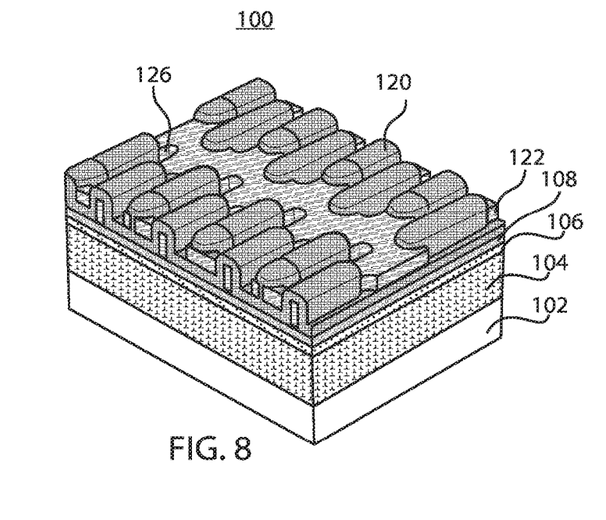
FIG. 8 is a perspective view of pattern transfer into the flowable material layer during the fabrication of the semiconductor device, in accordance with an embodiment of the present invention.

With reference to FIG. 8, patterns 126 are transferred into the flowable material layer 122, and the patterning material 124 is removed. Any suitable process can be used to transfer the patterns 126 into the flowable material layer 122 and remove the patterning material 124 in accordance with the embodiments described herein. Additionally, wide metals and/or open large pads can be added at this step.

In one embodiment, and as will be described in further detail below with reference to FIGS. 15-18, a via double patterning process can be performed after the process shown in FIG. 8.

Figure 9:
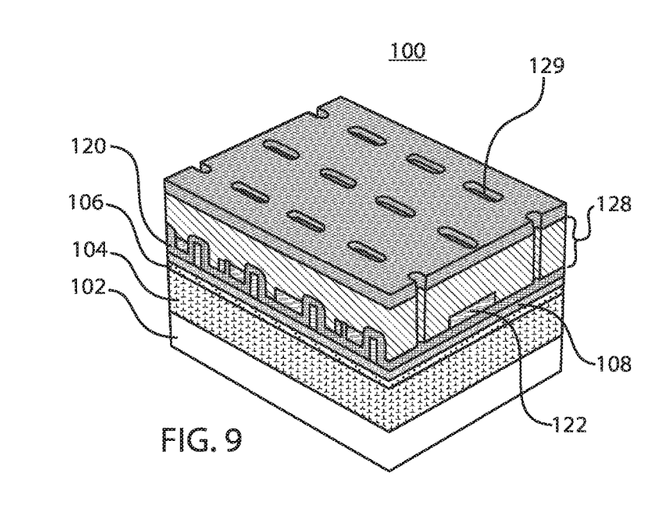
FIG. 9 is a perspective view of the formation of non-mandrel cut pattern regions in the patterning material during the fabrication of the semiconductor device, in accordance with an embodiment of the present invention.

With reference to FIG. 9, lithography is used to define non-mandrel cut patterns 129 transferred onto patterning material including an OPL layer 128 and an ARC layer 129 (e.g., SiARC). For example, a tapered ARC (e.g., SiARC) etch can be performed for critical dimension (CD) shrink. Any suitable materials can be used to form the OPL and ARC layers 128 and 129 in accordance with the embodiments described herein.

Figure 10:
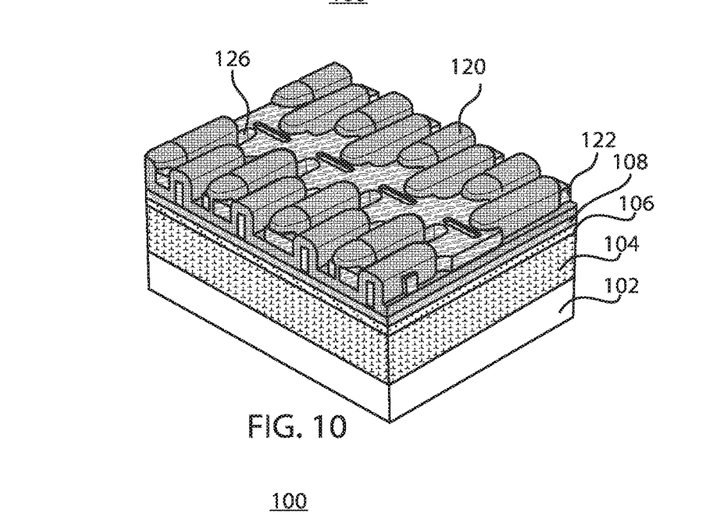
FIG. 10 is a perspective view of the formation of a non-mandrel cut pattern in the non-mandrel cut pattern regions and removal of the patterning material during the fabrication of the semiconductor device, in accordance with an embodiment of the present invention.

With reference to FIG. 10, another flowable material layer (not shown) can be formed by spin-coating and backfill into layers 128/129, and material can be etched back to a proper height then followed by a OPL ashing resulting flowable material layer 130. Any suitable processes can be used in accordance with the embodiments described herein.

Figure 11:
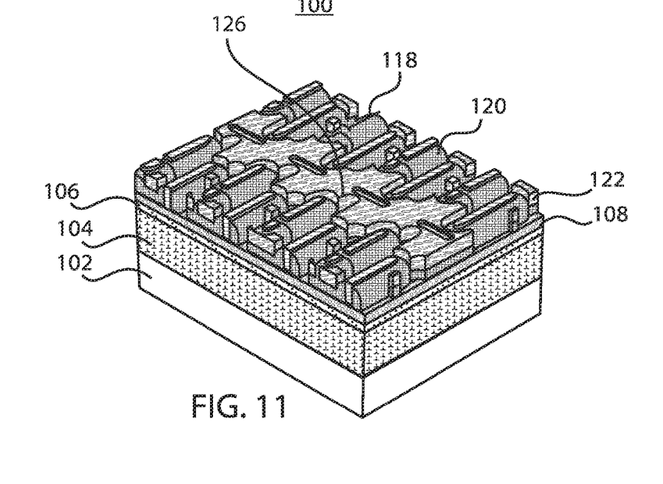
FIG. 11 is a perspective view of spacer etch back performed during the fabrication of the semiconductor device, in accordance with an embodiment of the present invention.

With reference to FIG. 11, an etch back process is performed to remove portions of the spacer material 120 to expose surfaces of the mandrels 118 and the hardmask layer 108. Any suitable etch process can be used to remove the portions of the spacer material 120 in accordance with the embodiments described herein.

Figure 12:
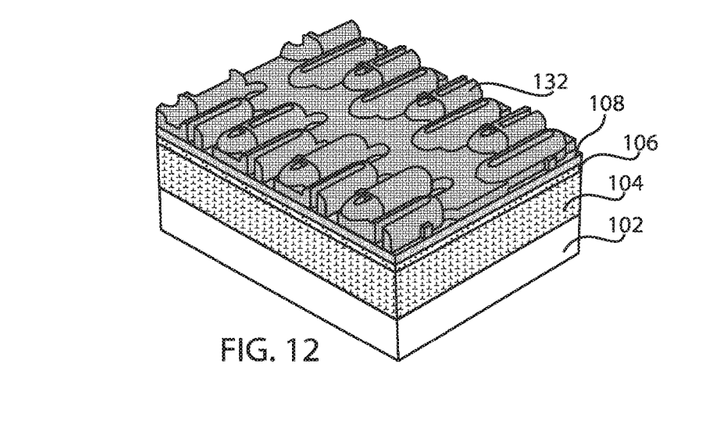
FIG. 12 is a perspective view of selective removal of the mandrel and non-mandrel materials during the fabrication of the semiconductor device, in accordance with an embodiment of the present invention.

With reference to FIG. 12, mandrel and non-mandrel materials including the mandrels 118 and the flowable material layer 122 are selectively removed, leaving processed spacer material 132. The processed spacer material 132 includes a pattern made of the spacer material 120, which is a union of mandrels and cuts. Any suitable process can be used to remove the mandrel and non-mandrel materials in accordance the embodiments described herein (e.g., mandrel pull).

Figure 13:
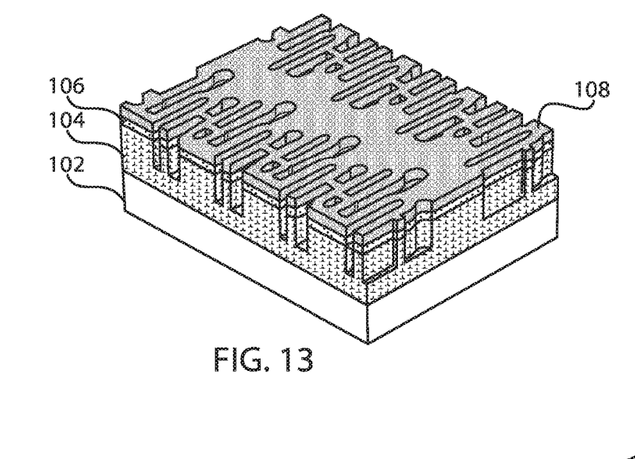
FIG. 13 is a perspective view of the etching of the hardmask, removal of remaining spacer material, and etching of the dielectric trench during the fabrication of the semiconductor device, in accordance with an embodiment of the present invention.

With reference to FIG. 13, a dielectric trench etch is finished by removing portions of the first and second dielectric sublayers 104 and 106 using the hardmask layer 108. For example, the hardmask layer 108 can be opened, the processed spacer material 132 can be removed (e.g., stripped), and an etch process (e.g., RIE) can be used to remove the portions of the first and second dielectric sublayers 104 and 106. Any suitable processes can be used in accordance with the embodiments described herein.

If the via double patterning process described below with reference to FIGS. 15-18 is not performed after the process shown in FIG. 8, in another embodiment, an alternative LELE via process can be added prior to the removal of the portions of the first and second dielectric sublayers 104 and 106 (e.g., after the hardmask opening or the spacer strip).

Figure 14:
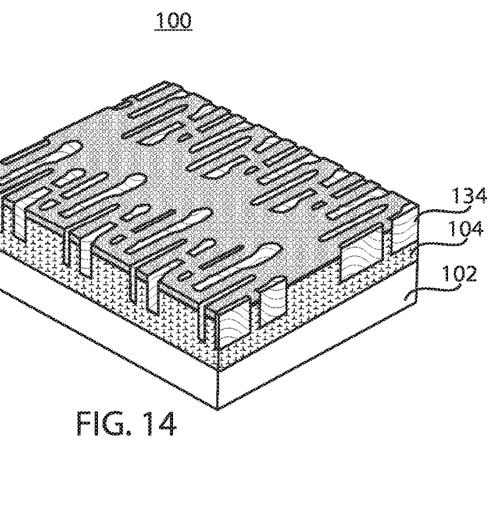
FIG. 14 is a perspective view of a metallization process performed during the fabrication of the semiconductor device, in accordance with an embodiment of the present invention.

With reference to FIG. 14, conductive material 134 is formed. For example, the conductive material 134 can include a metal material formed during a metallization process (e.g., a dual damascene process) by depositing the metal material and performing a planarization process (e.g., CMP). Any suitable process can be used to form the conductive material 134 in accordance with the embodiments described herein. Additionally, the conductive material 134 can include any suitable conductive material in accordance with the embodiments described herein (e.g., copper (Cu)).

FIGS. 1-14 have described an illustrative example of a base process flow for trench formation. A via double patterning process to form self-aligned will now be described below with reference to FIGS. 15-18. It is assumed that FIGS. 15-19 can occur after the spacer etch back described above with reference to FIG. 8.

Figure 15:
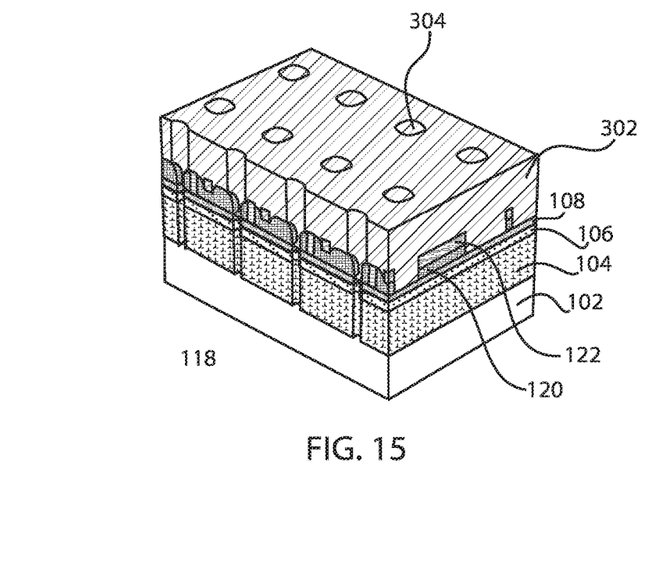
FIG. 15 is a perspective view of the patterning of the non-mandrel vias with lithography during the fabrication of the semiconductor device, in accordance with an embodiment of the present invention.

With reference to FIG. 15, lithography material including layer 302 is formed, and non-mandrel vias 304 are formed using lithography. In one embodiment, the layer 302 includes an OPL layer. Since the cuts have been transferred into the spacer material 120 underneath the flowable material layer 122, there is no need to worry about the cuts in the flowable material layer 122 being wiped out due to the lithography used to form the non-mandrel vias 304. If OVL control is acceptable, the mandrels 118 can include, e.g., SiN, the spacer material 120 can include, e.g., $SiO_2$, and the hardmask layer 108 can include, e.g, TiN. If self-align to mandrel/non-mandrel is needed, the mandrels 118 can include, e.g., SiN, the spacer material 120 can include, e.g., TaN or $TiO_2$, and the hardmask layer 108 can include, e.g., a-Si or TiN. Any suitable processes can be used to form the non-mandrel vias 304 in accordance with the embodiments described herein.

Figure 16:
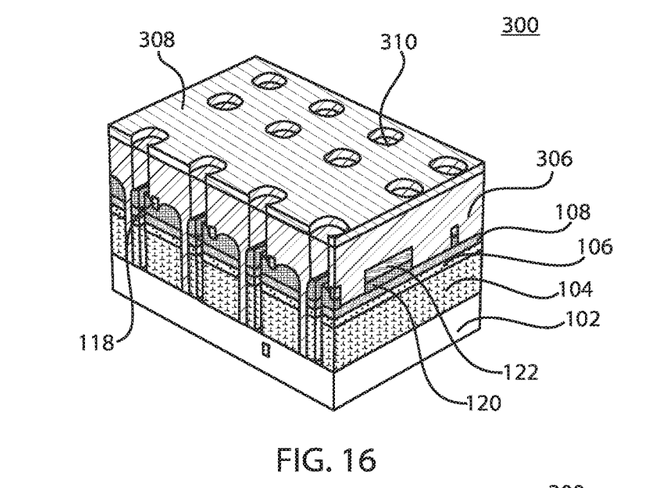
FIG. 16 is a perspective view of the patterning of the mandrel vias during the fabrication of the semiconductor device, in accordance with an embodiment of the present invention.

With reference to FIG. 16, lithography material including layers 306 and 308 is formed, and mandrel vias 310 are formed using lithography. In one embodiment, the layer 306 includes an OPL layer and the layer 308 includes an ARC (e.g., SiARC) layer. For example, a partial OPL etch can be performed to reveal the mandrels 118. Similar to FIG. 15, since the cuts have been transferred into the spacer material 120 underneath the flowable material layer 122, there is no need to worry about the cuts in the flowable material layer 122 being wiped out due to the lithography used to form the mandrel vias 310. Any suitable processes can be used to form the mandrel vias 310 in accordance with the embodiments described herein.

Figure 17:
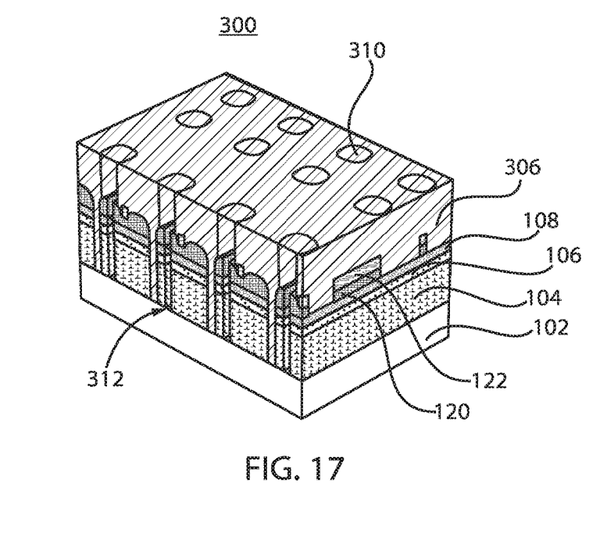
FIG. 17 is a perspective view of a selective mandrel etch during the fabrication of the semiconductor device, in accordance with an embodiment of the present invention.

With reference to FIG. 17, trenches 312 are formed by etching the mandrels 118, the hardmask layer 108 and the dielectric sublayers 104 and 106. The layer 308 is also removed. Any suitable processes can be used in accordance with the embodiments described herein.

Figure 18:
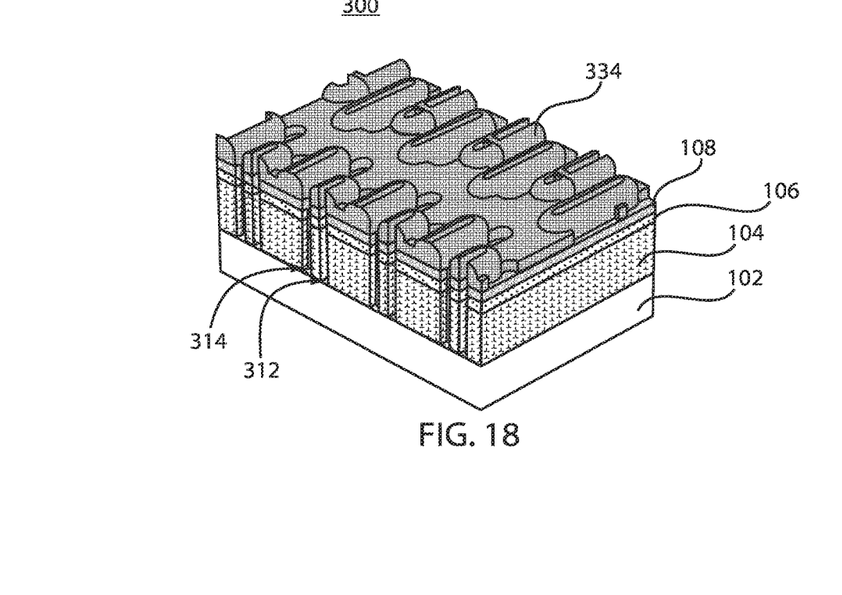
FIG. 18 is a perspective view of mandrel and non-mandrel removal during the fabrication of the semiconductor device, in accordance with an embodiment of the present invention.

With reference to FIG. 18, the trenches 314 are formed. Trenches 314 can be formed by removing the layer 306, coating a new protective layer (e.g., protective OPL layer) (not shown) into the vias, etching back to reveal the mandrels 118 and the flowable material 122. Then, mandrel and non-mandrel materials including the mandrels 118 and the flowable material layer 122 are selectively removed, leaving processed spacer material 334 (similar to the process spacer material 134 described above with reference to FIG. 12), as well as the protective layer. Any suitable processes can be used in accordance with the embodiments described herein.

After the process flow shown in FIGS. 15-18, the process can proceed back to FIG. 12/13 to remove the processed spacer material 334 and form the conductive material 138.

Figure 19:
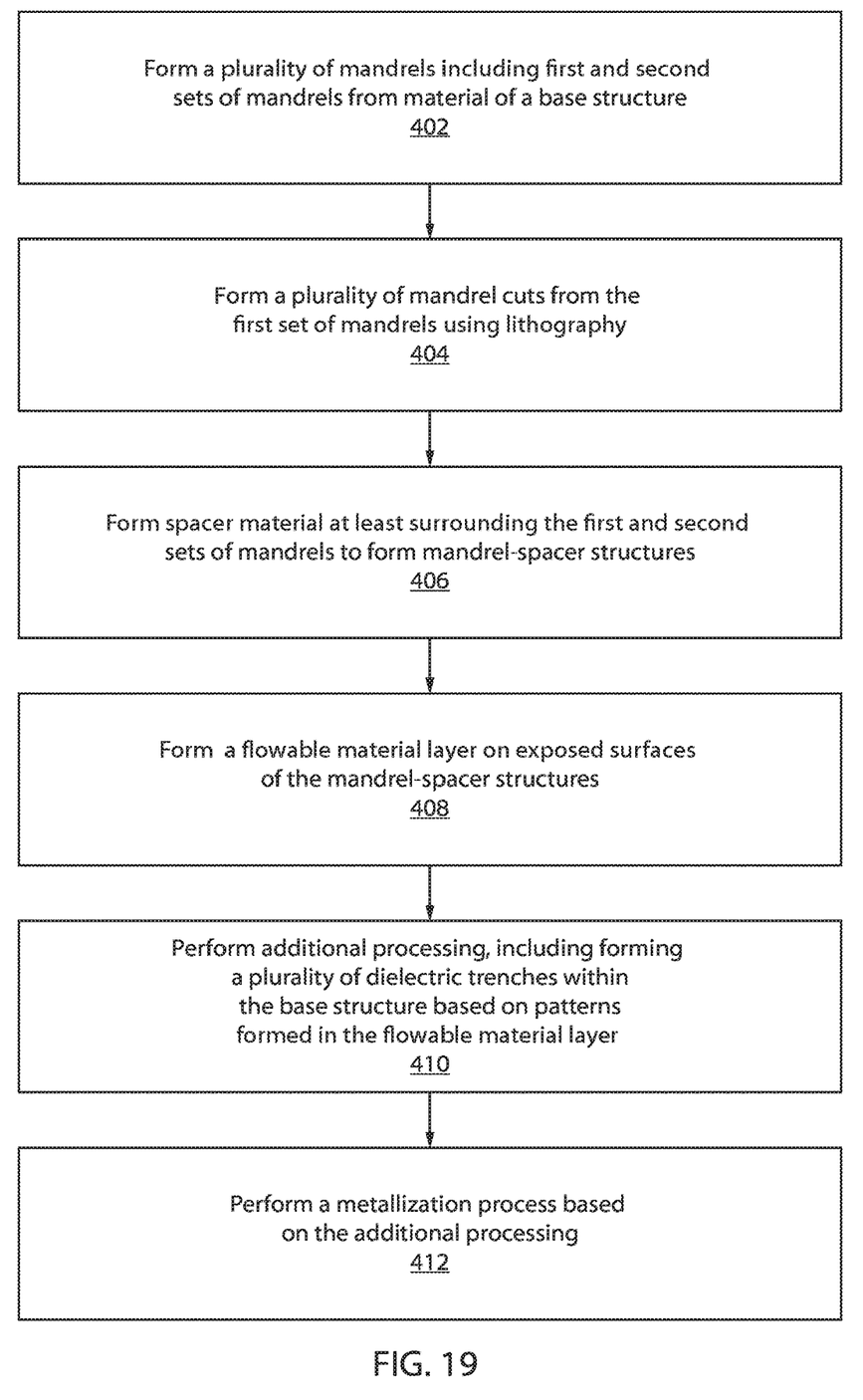
FIG. 19 is a block/flow diagram illustrating a system/method for fabricating a semiconductor device, in accordance with an embodiment of the present invention.

With reference to FIG. 19, a block/flow diagram is shown illustrating a system/method 400 for fabricating a semiconductor device including self-aligned vias and self-aligned blocks using a litho-etch-litho-etch (LELE) process.

At block 402, a plurality of mandrels including first and second sets of mandrels is formed from mandrel material of a base structure. The base structure can include a substrate, at least one dielectric sublayer formed on the substrate, and a hard mask layer on which the plurality of mandrels can be formed.

At block 404, a plurality of mandrel cuts is formed from the first set of mandrels using lithography. In one embodiment, forming the plurality of mandrel cuts can include performing a partial organic planarization layer (OPL) etch.

At block 406, spacer material is formed at least surrounding the first and second sets of mandrels to form mandrel-spacer structures. Forming the spacer material can further include depositing the spacer material on the hardmask layer.

At block 408, a flowable material layer is formed on exposed surfaces of the mandrel-spacer structures.

At block 410, additional processing is performed, including forming a plurality of dielectric trenches within the base structure based on patterns formed in the flowable material layer.

Performing the additional processing can further include transferring non-mandrel shape patterns into the flowable material layer, forming non-mandrel cut patterns in the flowable material layer, etching back the spacer material to expose surfaces of the plurality of mandrels, selectively removing mandrel and non-mandrel materials including the plurality of mandrels and the flowable material layer to form a final pattern including remaining portions of the spacer material, etching the hardmask layer using the final pattern, removing the remaining portions of the spacer material, and forming the plurality of dielectric trenches.

In one embodiment, forming the additional processing can further include performing a via double patterning process prior to forming the non-mandrel cut patterns. Performing the via double patterning process can include forming non-mandrel vias using lithography based on an organic planarization layer (OPL), forming mandrel vias using lithography, and forming first and second trenches.

The first trenches can be formed by etching the plurality of mandrels, the hardmask layer and the dielectric sublayers, and the second trenches can be formed by removing the OPL and coating a protective OPL layer into the non-mandrel and mandrel vias, etching back to reveal the plurality of mandrels and the flowable material layer, and selectively removing mandrel and non-mandrel materials including the plurality of mandrels and the flowable material layer.

At block 412, a metallization process is performed based on the additional processing. Performing the metallization process can include removing the hardmask layer, forming conductive material, and planarizing the conductive material.

Further details regarding blocks 402-412 are described above with reference to FIGS. 1-18.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including self-aligned vias and self-aligned blocks, comprising:
   forming a plurality of mandrel cuts in a first set of patterned mandrels of a base structure using lithography;
   surrounding the first set of patterned mandrels and a second set of patterned mandrels of the base structure with spacer material to form mandrel-spacer structures;
   forming a flowable material layer on exposed surfaces of the mandrel-spacer structures; and
   performing additional processing, including forming a plurality of dielectric trenches within the base structure based on patterns formed in the flowable material layer.

2. The method of claim 1, further comprising patterning a plurality of mandrels including the first and second sets of patterned mandrels from mandrel material of the base structure.

3. The method of claim 1, wherein forming the plurality of mandrel cuts further includes performing a partial organic planarization layer (OPL) etch.

4. The method of claim 1, wherein the base structure further includes:
   a substrate;
   at least one dielectric sublayer formed on the substrate; and
   a hardmask layer, wherein the plurality of mandrels are formed on the hardmask layer.

5. The method of claim 4, wherein surrounding the first and second sets of mandrels with spacer material further includes depositing the spacer material on the hardmask layer.

6. The method of claim 4, wherein performing the additional processing further includes:
   transferring non-mandrel shape patterns into the flowable material layer;
   forming non-mandrel cut patterns in the flowable material layer;
   etching back the spacer material to expose surfaces of the plurality of mandrels;
   selectively removing mandrel and non-mandrel materials including the plurality of mandrels and the flowable material layer to form a final pattern including remaining portions of the spacer material;
   etching the hardmask layer using the final pattern;
   removing the remaining portions of the spacer material; and
   forming the plurality of dielectric trenches.

7. The method of claim 6, further comprising performing a metallization process based on the additional processing, including removing the hardmask layer, forming conductive material, and planarizing the conductive material.

8. The method of claim 6, wherein performing the additional processing further includes performing a via double patterning process prior to forming the non-mandrel cut patterns.

9. The method of claim 8, wherein performing the via double patterning process further includes:
   forming non-mandrel vias using lithography based on an organic planarization layer (OPL);
   forming mandrel vias using lithography; and
   forming first and second trenches.

10. The method of claim 9, wherein:
    forming first trenches further includes etching the plurality of mandrels, the hardmask layer and the at least one dielectric sublayer; and
    forming the second trenches further includes:
       removing the OPL and coating a protective OPL layer into the non-mandrel and mandrel vias;
       etching back to reveal the plurality of mandrels and the flowable material layer; and
       selectively removing mandrel and non-mandrel materials including the plurality of mandrels and the flowable material layer.

11. A method for fabricating a semiconductor device including self-aligned vias and self-aligned blocks, comprising:
    patterning a plurality of mandrels including a first set of mandrels and a second set of mandrels from mandrel material of a base structure;
    forming a plurality of mandrel cuts in the first set of mandrels using lithography, including performing a partial organic planarization layer (OPL) etch;
    surrounding the first set of mandrels and a second set of mandrels of the base structure with spacer material to form mandrel-spacer structures;
    forming a flowable material layer on exposed surfaces of the mandrel-spacer structures; and
    performing additional processing, including forming a plurality of dielectric trenches within the base structure based on patterns formed in the flowable material layer.

12. The method of claim 11, wherein the base structure further includes:
    a substrate;
    at least one dielectric sublayer formed on the substrate; and
    a hardmask layer, wherein the plurality of mandrels are formed on the hardmask layer.

13. The method of claim 12, wherein surrounding the first and second sets of mandrels with spacer material further includes depositing the spacer material on the hardmask layer.

14. The method of claim 12, wherein performing the additional processing further includes:
    transferring non-mandrel shape patterns into the flowable material layer;
    forming non-mandrel cut patterns in the flowable material layer;
    etching back the spacer material to expose surfaces of the plurality of mandrels;
    selectively removing mandrel and non-mandrel materials including the plurality of mandrels and the flowable material layer to form a final pattern including remaining portions of the spacer material;
    etching the hardmask layer using the final pattern;
    removing the remaining portions of the spacer material; and
    forming the plurality of dielectric trenches.

15. The method of claim 14, further comprising performing a metallization process, including removing the hardmask layer, forming conductive material, and planarizing the conductive material.

16. The method of claim 14, wherein performing the additional process further includes performing a via double patterning process prior to forming the non-mandrel cut patterns.

17. The method of claim 16, wherein performing the via double patterning process further includes:
    forming non-mandrel vias using lithography based on an organic planarization layer (OPL);
    forming mandrel vias using lithography; and
    forming first and second trenches.

18. The method of claim 17, wherein:
    forming first trenches further includes etching the plurality of mandrels, the hardmask layer and the at least one dielectric sublayer; and
    forming the second trenches further includes:
       removing the OPL and coating a protective OPL layer into the non-mandrel and mandrel vias;
       etching back to reveal the plurality of mandrels and the flowable material layer; and
       selectively removing mandrel and non-mandrel materials including the plurality of mandrels and the flowable material layer.

19. A method for fabricating a semiconductor device including self-aligned vias and self-aligned blocks, comprising:

forming, on a hardmask layer of a base structure, a plurality of mandrels including a first set of mandrels and a second set of mandrels from mandrel material of a base structure, the base structure further including a substrate and at least one dielectric sublayer formed on the substrate;

forming a plurality of mandrel cuts from the first set of mandrels using lithography, including performing a partial organic planarization layer (OPL) etch;

surrounding the first set of mandrels and a second set of mandrels of the base structure with spacer material to form mandrel-spacer structures, including depositing the spacer material on the hardmask layer;

forming a flowable material layer on exposed surfaces of the mandrel-spacer structures;

performing additional processing, including:
  transferring non-mandrel shape patterns into the flowable material layer;
  forming non-mandrel cut patterns in the flowable material layer;
  etching back the spacer material to expose surfaces of the plurality of mandrels;
  selectively removing mandrel and non-mandrel materials including the plurality of mandrels and the flowable material layer to form a final pattern including remaining portions of the spacer material;
  etching the hardmask layer using the final pattern;
  removing the remaining portions of the spacer material; and
  forming a plurality of dielectric trenches within the base structure based on the patterns; and performing a metallization process, including removing the hardmask layer, forming conductive material and planarizing the conductive material.

20. The method of claim 19, wherein performing the additional process further includes performing a via double patterning process prior to forming the non-mandrel cut patterns, including:

forming non-mandrel vias using lithography based on an organic planarization layer (OPL) by etching the plurality of mandrels, the hardmask layer and the at least one dielectric sublayer;

forming mandrel vias using lithography, including:
  removing the OPL and coating a protective OPL layer into the non-mandrel and mandrel vias;
  etching back to reveal the plurality of mandrels and the flowable material layer; and
  selectively removing mandrel and non-mandrel materials including the plurality of mandrels and the flowable material layer; and forming first and second trenches.

\* \* \* \* \*